(12) United States Patent
Choi et al.

(10) Patent No.: US 9,263,474 B2
(45) Date of Patent: Feb. 16, 2016

(54) THIN FILM TRANSISTOR ARRAY SUBSTRATE AND ORGANIC LIGHT-EMITTING DISPLAY APPARATUS INCLUDING THE SAME

(71) Applicant: Samsung Display Co., Ltd., Yongin, Gyeonggi-do (KR)

(72) Inventors: Dong-Wan Choi, Yongin (KR); Jin-Oh Park, Yongin (KR); Hyo-Sang Yang, Yongin (KR); Hee-Kwon Eun, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 1 day.

(21) Appl. No.: 14/067,926

(22) Filed: Oct. 30, 2013

(65) Prior Publication Data

US 2015/0001478 A1   Jan. 1, 2015

(30) Foreign Application Priority Data

Jun. 28, 2013   (KR) .................... 10-2013-0075936

(51) Int. Cl.
*H01L 27/32* (2006.01)
*H01L 27/12* (2006.01)

(52) U.S. Cl.
CPC .......... *H01L 27/124* (2013.01); *H01L 27/3276* (2013.01)

(58) Field of Classification Search
CPC ............... G09G 2300/023; G09G 2300/0426; G09G 2380/02
USPC ...................................................... 345/1.3, 98
See application file for complete search history.

(56) References Cited

U.S. PATENT DOCUMENTS

| | | | |
|---|---|---|---|
| 2012/0050958 A1* | 3/2012 | Sanford et al. | ........... 361/679.01 |
| 2013/0044074 A1* | 2/2013 | Park et al. | ..................... 345/174 |
| 2013/0047267 A1 | 2/2013 | Lipscomb | |
| 2013/0328755 A1* | 12/2013 | Al-Dahle et al. | ............... 345/87 |
| 2014/0111953 A1* | 4/2014 | McClure et al. | .............. 361/749 |

FOREIGN PATENT DOCUMENTS

| | | |
|---|---|---|
| KR | 10-2006-0020028 A | 3/2006 |
| KR | 10-2012-0035744 A | 4/2012 |
| WO | WO 03/060858 A1 | 7/2003 |

* cited by examiner

*Primary Examiner* — David Vu
*Assistant Examiner* — Jonathan Han
(74) *Attorney, Agent, or Firm* — Lewis Roca Rothgerber Christie LLP

(57) ABSTRACT

A thin film transistor array substrate includes an active area in which a plurality of pixels are formed; driver integrated circuits (DICs) disposed in a non-active area around the active area and configured to supply a driving signal to each of the plurality of pixels; power input units partially overlapping with the DICs, disposed below the DICs, and configured to supply power voltages to the active area; and a user key mounting area formed not to overlap with the DICs in the non-active area. The thin film transistor array substrate may be used for an organic light-emitting display apparatus.

15 Claims, 6 Drawing Sheets

THIN FILM TRANSISTOR ARRAY SUBSTRATE AND ORGANIC LIGHT-EMITTING DISPLAY APPARATUS INCLUDING THE SAME

CROSS-REFERENCE TO RELATED APPLICATION

This application claims priority to and the benefit of Korean Patent Application No. 10-2013-0075936, filed on Jun. 28, 2013, in the Korean Intellectual Property Office, the disclosure of which is incorporated herein in its entirety by reference.

BACKGROUND

1. Field

The following description relates to a thin film transistor array substrate and an organic light-emitting display apparatus including the same.

2. Description of the Related Art

A recent trend is that conventional display apparatuses are being replaced with portable thin flat panel display apparatuses. Because flat panel display apparatuses employ a button key and/or a touch key as input units, a reduction in the bezel thickness of flat panel display apparatuses is limited.

SUMMARY

Aspects of embodiments of the present invention are directed toward a compact organic light-emitting display apparatus capable of reducing the bezel thickness.

According to an embodiment of the present invention, a thin film transistor array substrate includes: an active area including a plurality of pixels; driver integrated circuits (DICs) at a non-active area around the active area and configured to supply a driving signal to each of the plurality of pixels; power input units partially overlapping with the DICs, located below the DICs, and configured to supply power voltages to the active area; and a user key mounting area formed in the non-active area and does not overlap with the DICs.

The thin film transistor array substrate may further include: a mechanical button mounted in the user key mounting area.

A plurality of the DICs may be spaced apart from each other.

The plurality of DICs may be coupled in series with each other.

The thin film transistor array substrate may further include: a flexible printed circuit (FPC) electrically coupled to at least one of the plurality of DICs.

The thin film transistor array substrate may further include: power lines at the active area and configured to supply the power voltages from the power input units to each of the plurality of pixels.

The power lines may include: a first power line configured to supply a first power voltage to a first electrode of an emission device of each of the plurality of pixels; and a second power line configured to supply a second power voltage to a second electrode of the emission devices.

According to another embodiment of the present invention, an organic light-emitting display apparatus includes: a substrate including an active area and a non-active area around the active area; a plurality of pixels at the active area; DICs disposed in the non-active area and configured to supply driving signals to the plurality of pixels; power input units partially overlapping with the DICs, located below the DICs, and configured to supply power voltages; and user keys mounted in a region of the non-active area that does not overlap with the DICs.

The user keys may include mechanical buttons.

A plurality of the DICs may be spaced apart from each other.

The plurality of DICs may be coupled in series with each other.

The organic light-emitting display apparatus may further include: an FPC electrically coupled to at least one of the plurality of DICs.

The organic light-emitting display apparatus may further include: power lines at the active area and configured to supply the power voltages from the power input units to each of the plurality of pixels.

The power lines may include: a first power line configured to supply a first power voltage to a first electrode of an emission device of each of the plurality of pixels; and a second power line configured to supply a second power voltage to a second electrode of the emission device of each of the plurality of pixels.

The organic light-emitting display apparatus may further include: an encapsulation member facing the substrate; and a touch panel on the encapsulation member.

BRIEF DESCRIPTION OF THE DRAWINGS

The above and other features and aspects of the present invention will become more apparent by describing in more detail example embodiments thereof with reference to the attached drawings in which.

DETAILED DESCRIPTION

Figure 1:
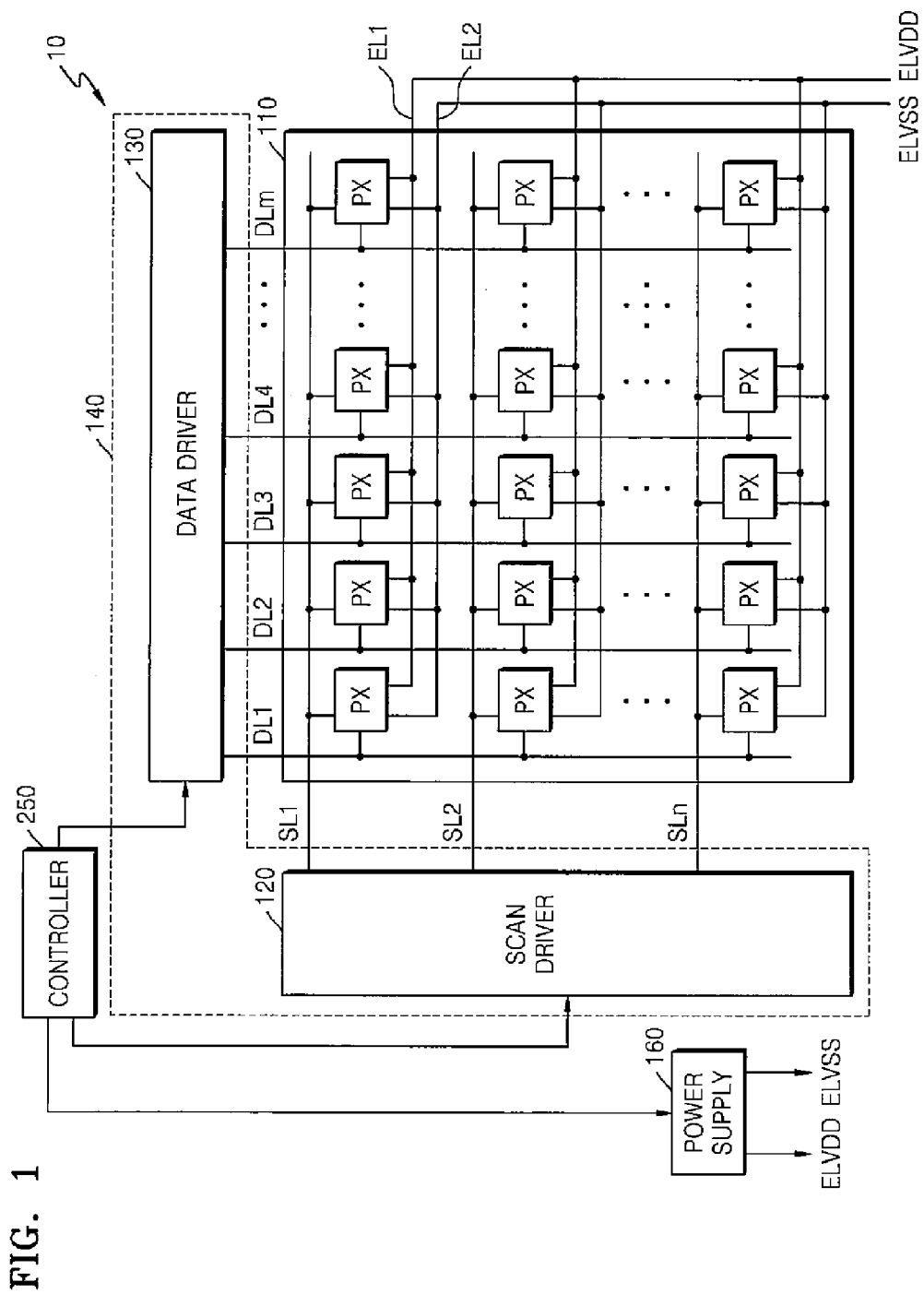
FIG. 1 is a schematic diagram of a display apparatus according to an embodiment of the present invention.

Hereinafter, the present invention will be described in more detail by explaining example embodiments of the invention with reference to the attached drawings. The invention may, however, be embodied in many different forms, and should not be construed as being limited to the embodiments set forth herein; rather, these embodiments are provided so that this disclosure will be thorough and complete, and will fully convey the concept of the invention to those skilled in the art.

In the following description, well-known functions or constructions are not described in detail since they would obscure the invention with unnecessary detail, and like reference numerals in the drawings denote like or similar elements throughout the specification.

Also, the thicknesses and sizes of elements in the drawings are arbitrarily shown for convenience of description, thus, the spirit and scope of the present invention are not necessarily defined by the drawings.

In the drawings, the thicknesses of layers and regions are exaggerated for clarity. Throughout the specification, it will also be understood that when an element such as layer, region, or substrate is referred to as being "on" another element, it can be directly on the other element, or intervening elements may also be present.

Also, when a part "includes" or "comprises" an element, unless there is a particular description contrary thereto, the part can further include other elements, and not excluding the other elements. In addition, throughout the specification, it will also be understood that when an element is referred to as being "above" a target element, it means that the element can be above or below the target element and it does not mean that the element is always above the target element in a gravitational direction.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

FIG. 1 is a schematic diagram of a display apparatus 10 according to an embodiment of the present invention.

Referring to FIG. 1, the display apparatus 10 may include various types of display apparatuses, such as an organic light-emitting display apparatus, a liquid crystal display apparatus, an electroluminescent display apparatus, a plasma display apparatus, or the like. The organic light-emitting display apparatus will now be described below as an example.

The display apparatus 10 includes a display unit 110, a driving unit 140, a controller 250, and a power supply 160.

The display unit 110 includes a plurality of scan lines SL1 through SLn that are formed in (e.g., extend in) a row direction and transfer scan signals, and a plurality of data lines DL1 through DLm that are formed in (e.g., extend in) a column direction and transfer data signals. The plurality of scan lines SL1 through SLn and the plurality of data lines DL1 through DLm are arrayed in a matrix-like shape, and pixels PX are formed at crossing regions between the plurality of scan lines SL1 through SLn and the plurality of data lines DL1 through DLm.

A first power line EL1 and a second power line EL2 that transfer power voltages to the pixels PX are also arranged in the display unit 110. Although the first power line EL1 and the second power line EL2 arranged in the row direction are shown in FIG. 1, the present invention is not limited thereto. The first power line EL1 and the second power line EL2 may be arranged in one of the row and column directions, and each may be arranged in a mesh form in the row and column directions.

The pixels PX receive the scan signals, the data signals, and the power voltages through the plurality of scan lines SL1 through SLn, the plurality of data lines DL1 through DLm, and the first power line EL1 and the second power line EL2, respectively, and emit light to form an image.

The driving unit 140 may include a scan driver 120 and a data driver 130.

The scan driver 120 is coupled to the plurality of scan lines SL1 through SLn and sequentially applies the scan signals including combinations of gate on voltages and gate off voltages to the pixels PX through the plurality of scan lines SL1 through SLn.

The data driver 130 is coupled to the plurality of data lines DL1 through DLm. When the gate on voltage is applied to the pixels PX, the data driver 130 applies the data signals to the pixels PX through the plurality of data lines DL1 through DLm.

The controller 250 generates scan driving control signals for controlling the scan driver 120, generates data driving control signals for controlling the data driver 130, and supplies pixel data to the data driver 130. The controller 250 supplies a power control signal to the power supply 160 for controlling the power voltage supplied to the display unit 110 or cut-off the power voltage supplied to the display unit 110.

The power supply 160 converts power supplied from an external power source into a voltage of various levels, and supplies the voltage to the display unit 110 according to the power control signal received from the controller 250. For example, the power supply 160 may generate and supply a first power voltage ELVDD and a second power voltage ELVSS to each of the pixels PX. The first power voltage ELVDD may be a set or predetermined high level voltage. The second power voltage ELVSS may be a voltage lower than the first power voltage ELVDD or a ground voltage.

Figure 2:
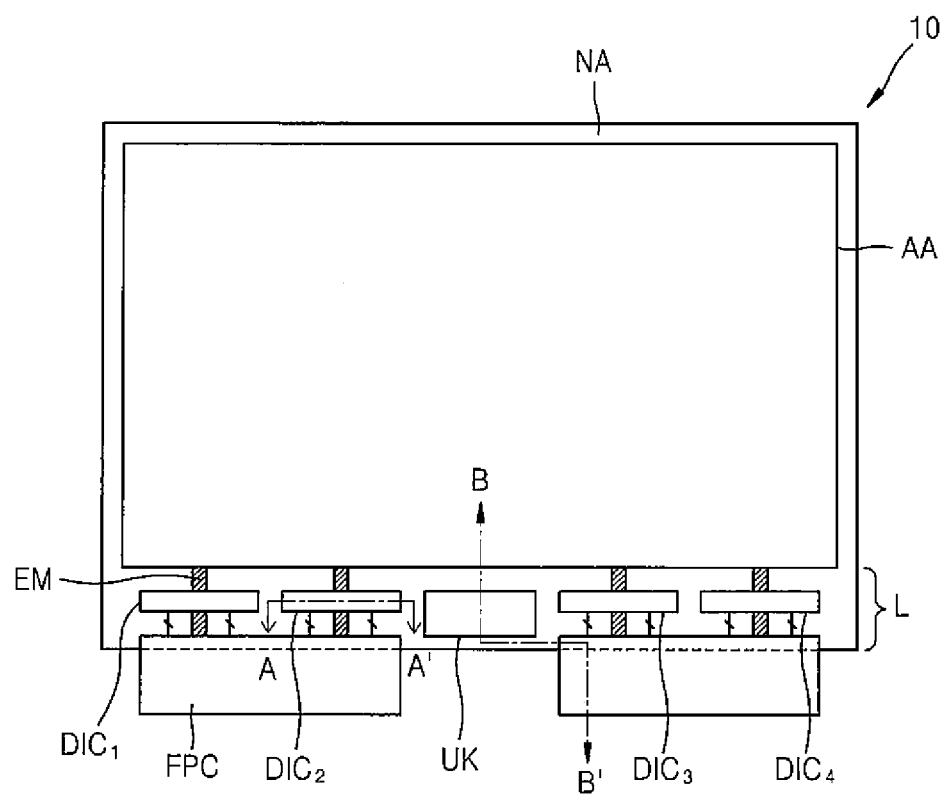
FIG. 2 is a schematic plan view of a display apparatus according to an embodiment of the present invention.
Figure 3:
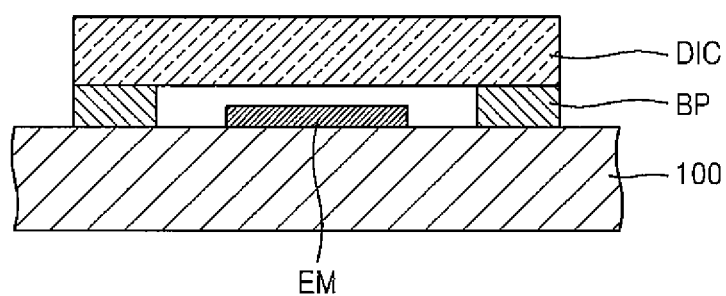
FIG. 3 is a cross-sectional view taken along the line A-A' of FIG. 2.
Figure 4:
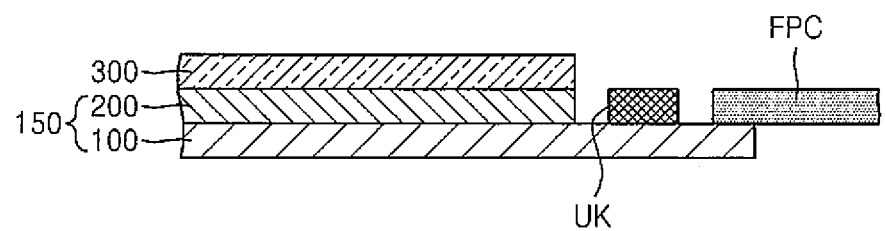
FIG. 4 is a cross-sectional view taken along the line B-B' of FIG. 2.

FIG. 2 is a schematic plan view of the display apparatus 10 according to an embodiment of the present invention. FIG. 3 is a cross-sectional view taken along the line A-A' of FIG. 2. FIG. 4 is a cross-sectional view taken along the line B-B' of FIG. 2.

Referring to FIGS. 2 through 4, the display apparatus 10 includes a display panel 150 having a first substrate 100 and a second substrate 200 bonded to the first substrate 100 through sealing. The display apparatus 10 may further include a touch panel 300 on the display panel 150.

The first substrate 100 may be a flexible substrate and may be formed of a plastic material having good heat resistance and durability, such as polyethylene terephthalate (PET), polyethylene naphthalate (PEN), polycarbonate (PC), polyarylate (PAR), polyetherimide (PEI), or the like. The first substrate 100 may also be formed of various other suitable materials, such as a metal, glass, or the like.

The second substrate 200 may be an encapsulation member disposed on the first substrate 100 to block a thin film transistor, an emission device, or the like formed on the first substrate 100 from external moisture, air, or the like. Similarly to the first substrate 100, the second substrate 200 may be a flexible substrate and may be formed of various suitable materials, such as a metal, glass, or the like. The second substrate 200 may be a thin film encapsulation (TFE) layer having a structure in which a plurality of inorganic films and a plurality of organic films are alternately stacked.

The second substrate 200 is disposed to face the first substrate 100. The first substrate 100 and the second substrate 200 are bonded to each other by a sealing member disposed along edges thereof.

The display panel 150 includes an active area AA in which light is emitted to display contents of various types of images, etc. on a screen, and a non-active area NA around the active area AA.

The touch panel 300 detects a touch in an area of the display panel 150 corresponding to the active area AA. The touch panel 300 is an input device for inputting a user's command by selecting an indication displayed on a screen with a human hand or an object. Here, the touch panel 300 is disposed on a front face of the display apparatus 10 and converts a touch position directly contacting the human hand or the object into an electrical signal. Accordingly, an indication selected at the touch position is input as an input signal. The touch panel 300 may replace a separate input device, such as a keyboard or a mouse. The touch panel 300 may extend to an area corresponding to the non-active area NA. For example, the touch panel 300 may implement a function of a menu key independently from a user key UK mounted on the first substrate 100 by forming a touch key in an area corresponding to a ledge unit L.

The touch panel 300 may be implemented as a resistive touch panel, a photosensitive touch panel, a capacitive touch panel, or the like. The capacitive touch panel converts the touch position into an electrical signal by detecting a change in a capacitance formed between a conductive sensing pattern and another neighboring sensing pattern or a ground electrode when the touch panel 300 contacts the human hand or the object. A window may be further provided on the touch panel 300 to increase the mechanical strength. Alternatively, the touch panel 300 may be a window-integrated touch panel including a window function.

The display unit 110 as shown in FIG. 1 may be located at the active area AA of the first substrate 100. Accordingly, the active area AA may include a plurality of scan lines SL, a plurality of data lines DL, and a power line EL; and the plurality of pixels PX. Each of the pixels PX may include a pixel circuit including one or more thin film transistors and a capacitor, and an emission device that emits light by the pixel circuit. The arrangement of a plurality of the thin film transistors, the emission devices, and the capacitors is referred to as a thin film transistor array. The first substrate 100 may be a thin film transistor array substrate having the thin film transistor array located at the active area AA. The power line EL may include the first power line EL1 and the second power line EL2 that respectively supply the first power voltage ELVDD and the second power voltage ELVSS.

A driver integrated circuit (DIC) in which a driver for supplying a driving signal for the pixels PX of the active area AA is integrated is mounted in a chip on glass (COG) scheme on one side of the non-active area NA of the first substrate 100. The area in which the DIC is mounted is referred to as the ledge unit L.

Scan pads for transferring scan signals applied from the DIC may be formed one side of the scan lines SL. Data pads for transferring data signals applied from the DIC may be formed one side of the data lines DL. Bumps BP connectable to the scan pads and the data pads are formed on the DIC. The DIC is bonded to a mounting area on the first substrate 100 by using the bumps BP and an anisotropic conductive film.

One DIC may be mounted on the first substrate 100. A plurality of DICs corresponding to a plurality of areas of the active area AA may be mounted on the first substrate 100. Although first through fourth DICs (i.e., DIC1 through DIC4) for supplying driving signals to four areas respectively are shown in FIG. 1, the present invention is not limited thereto. One or more DICs may be provided.

One or more scan drivers 120 and one or more data drivers 130 may be integrated in the first through fourth DICs DIC1 through DIC4. The scan drivers 120 may be directly located at the non-active area NA of the first substrate 100.

Power input units EM for applying power voltages to the first and second power lines EL1 and EL2 arranged in the active area AA partially overlap with the first through fourth DICs DIC1 through DIC4 and are formed below the first through fourth DICs DIC1 through DIC4. Although the power input unit EM is illustrated in one line in FIGS. 2 and 3, the power input unit EM may include two lines respectively coupled to the first and second power lines EL1 and EL2.

If the power input units EM are disposed in parallel to the first through fourth DICs DIC1 through DIC4 and between the first through fourth DICs DIC1 through DIC4, as in comparable display panels, since the ledge unit L does not secure (or provide) an area in which the user key UK can be disposed, the user key UK is disposed at a lower end of the ledge unit L in one embodiment. Accordingly, the bezel thickness of the display apparatus 10 increases.

In the present embodiment, the power input units EM are not disposed in parallel to the first through fourth DICs DIC1 through DIC4 but are disposed below the first through fourth DICs DIC1 through DIC4. Accordingly, an area degree of freedom increases between the first through fourth DICs DIC1 through DIC4, and spaces therebetween may be adjusted, thereby securing (or providing) the area needed for mounting the user key UK in the ledge unit L.

In the present embodiment, the power input units EM partially overlap with the first through fourth DICs DIC1 through DIC4 and are formed below the first through fourth DICs DIC1 through DIC4, so that the area for mounting the user key UK may be located at the ledge unit L, and thus it is unnecessary to mount the user key UK in a lower end of the ledge unit L, thereby minimizing or reducing the bezel thickness of the display apparatus 10.

In the present embodiment, the first through fourth DICs DIC1 through DIC4 are disposed at the left and the right sides of the ledge unit L, and the area for mounting the user key UK does not overlap with the first through fourth DICs DIC1 through DIC4 and is formed at a center portion of the ledge unit L. An outer shape of the user key UK may be processed by using laser in the area for mounting the user key UK. The user key UK may be inserted into the area for mounting the user key UK. The user key UK may include a mechanical button or a touch key. One or more user keys UK may be provided. The display apparatus 10 detects pressing performed on the user key UK and performs an allocated or predefined function.

A flexible printed circuit (FPC) electrically connects the first through fourth DICs DIC1 through DIC4 and an external circuit. The external circuit may be a printed circuit board (PCB) including the controller 250 and the power supply 160. The FPC may receive various control signals from the external circuit, for example, the PCB, and transmit the control signals to the first through fourth DICs DIC1 through DIC4. Signal lines for transferring signals output by the FPC may be formed not to overlap with the power input units EM.

Figure 5:
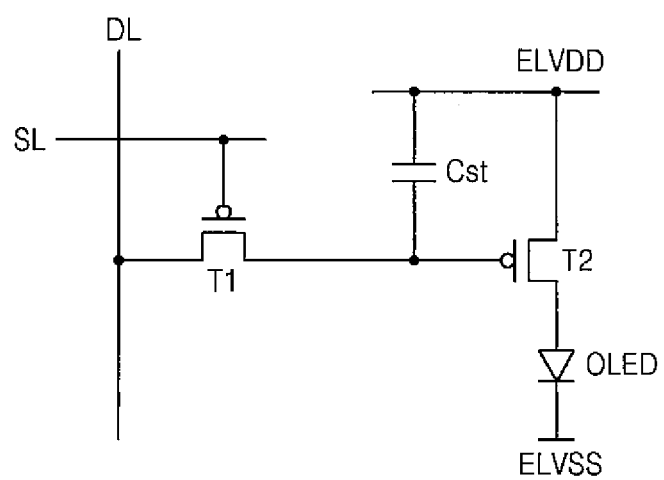
FIG. 5 is a circuit diagram of a pixel according to an embodiment of the present invention.

FIG. 5 is a circuit diagram of the pixel PX according to an embodiment of the present invention.

Referring to FIG. 5, the pixel PX of the active area AA may include first and second thin film transistors T1 and T2, and a capacitor Cst.

A gate electrode of the first thin film transistor T1 is coupled to the scan line SL. A first electrode of the first thin film transistor T1 is coupled to the data line DL. A second electrode of the first thin film transistor T1 is coupled to a first electrode of the capacitor Cst and a gate electrode of the second thin film transistor T2.

The gate electrode of the second thin film transistor T2 is coupled to the second electrode of the first thin film transistor T1 and the first electrode of the capacitor Cst. A first electrode of the second thin film transistor T2 is coupled to the first power line EL1 for supplying the first power voltage ELVDD. A second electrode of the second thin film transistor T2 is coupled to an anode of an OLED.

The first electrode of the capacitor Cst is coupled between the second electrode of the first thin film transistor T1 and the gate electrode of the second thin film transistor T2. A second electrode of the capacitor Cst is coupled to the first power line EL1 for supplying the first power voltage ELVDD.

The anode electrode of the OLED is coupled to the second electrode of the second thin film transistor T2. A cathode electrode of the OLED is coupled to the second power line EL2 for supplying the second power voltage ELVSS.

When a scan signal is provided from the scan line SL, the first thin film transistor T1 transfers the data signal supplied from the data line DL to the first electrode of the capacitor Cst. Accordingly, a voltage corresponding to the data signal is charged in the capacitor Cst, and a driving current corresponding to the voltage charged in the capacitor Cst is transferred to the OELD through the second thin film transistor T2, and thus the OLED emits light.

Although the pixel PX of FIG. 5 has a 2 Tr-1 Cap structure including two thin film transistors and one capacitor in one pixel, the present invention is not limited thereto. That is, the pixel PX may have various structures including two or more thin film transistors and one or more capacitors by forming additional wirings or omitting some of the existing wirings.

Figure 6:
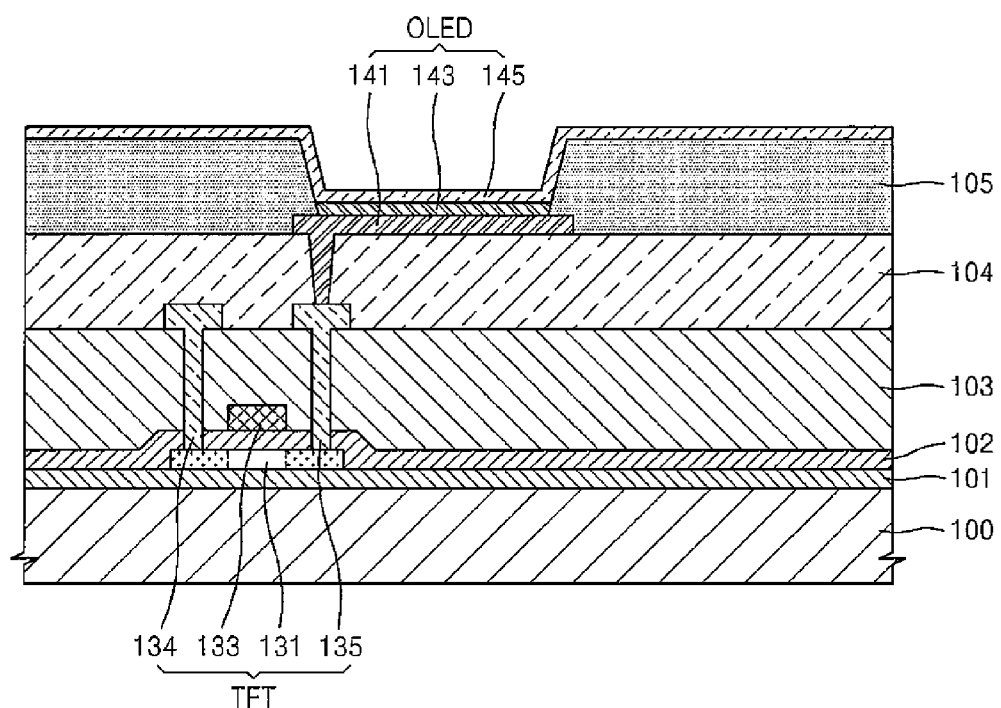
FIG. 6 is a cross-sectional view of the pixel of FIG. 5.

FIG. 6 is a cross-sectional view of the pixel PX of FIG. 5.

For convenience of description, only an OLED and a thin film transistor TFT coupled to the OLED are shown in FIG. 6. Referring to FIG. 6, a buffer layer 101 is formed on the first substrate 100, and a pixel circuit including the thin film transistor TFT is formed on the buffer layer 101.

The buffer layer 101 functions to prevent penetration of impurity elements and planarize a surface of the first substrate 100, and may be formed of various suitable materials for this function. For example, the buffer layer 101 may be formed of an inorganic material, such as a silicon oxide, a silicon nitride, a silicon oxynitride, an aluminum oxide, an aluminum nitride, a titanium oxide, a titanium nitride, or the like; an organic material, such as polyimide, polyester, acryl, or the like; or a laminated body thereof. The buffer layer 101 is not an indispensable constituent element and may not be provided according to circumstances.

An active layer 131 is formed on the buffer layer 101. The active layer 131 may be formed of an inorganic semiconductor, such as amorphous silicon or polysilicon, or an organic semiconductor. The active layer 131 has a source region, a drain region, and a channel region therebetween.

A gate insulating layer 102 is formed on the buffer layer 101 to cover the active layer 131. A gate electrode 133 is formed on the gate insulating layer 102 to correspond to the channel region of the active layer 131. The gate insulating layer 102 may be formed of an organic insulating material or an inorganic insulating material, or may have a multi-layer structure in which an organic insulating material and an inorganic insulating material are alternated. The gate electrode 133 may include at least one material selected from silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoW), and copper (Cu).

An interlayer insulating layer 103 is formed on the gate insulating layer 102 to cover the gate electrode 133, and a source electrode 134 and a drain electrode 135 are formed on the interlayer insulating layer 103 and respectively contact the source region and the drain region of the active layer 131 through contact holes. The interlayer insulating layer 103 may be formed of an organic insulating material or an inorganic insulating material, or may have a multi-layer structure in which an organic insulating material and an inorganic insulating material are alternated. The source electrode 134 and the drain electrode 135 may be formed of a material selected from the same materials as the gate electrode 133 but are not limited thereto and may be formed of various suitable conductive materials.

A structure of the thin film transistor TFT is not necessarily limited to the above-described structure, and various structures of the thin film transistor TFT may be applied.

A passivation layer 104 is formed on the interlayer insulating layer 103 to cover the thin film transistor TFT. The passivation layer 104 may be an insulating layer having a single layer structure or a multilayer structure in which an upper surface is planarized. The passivation layer 104 may be formed of an inorganic material and/or an organic material.

A first electrode 141 of the OLED electrically coupled to the thin film transistor TFT is formed on the passivation layer 104. A pixel defining layer 105 that covers the outer boundary of the first electrode 141 is formed, and a set or predetermined aperture is formed in the pixel defining layer 105 to expose the first electrode 141.

An intermediate layer 143 including an organic emissive layer (EML) is formed on the exposed upper surface of the first electrode 141, and a second electrode 145 that covers the intermediate layer 143 and the pixel defining layer 105 and faces the first electrode 141 is formed. As such, the OLED including the first electrode 141, the intermediate layer 143, and the second electrode 145 is formed.

The pixel defining layer 105 may be formed of an organic material, such as a polyacrylates resin, polyimides, or the like; an inorganic material such as silica; or the like.

The intermediate layer 143 may be formed to have a single layer structure or a complex structure by stacking the organic EML and one or more layers from among other function layers, such as a hole transport layer (HTL), a hole injection layer (HIL), an electron transport layer (ETL), or an electron injection layer (EIL). The organic EML may be formed of a low-molecular weight or high-molecular weight organic material. When the organic EML emits red, green, and blue lights, the organic EML may be patterned as a red EML, a green EML, and a blue EML according to a red sub-pixel, a green sub-pixel, and a blue sub-pixel. When the organic EML emits white light, the organic EML may have a multi-layer structure in which a red EML, a green EML, and a blue EML are stacked or a single-layer structure including a red emission material, a green emission material, and a blue emission material to emit the white light.

When a display apparatus has a top emission structure, the first electrode 141 may be a reflective electrode, and the second electrode 145 may be a phototransmissive electrode. In this case, the second electrode 145 may include a half-transmissive reflective film formed as a thin film of Ag, Mg, Al, Pt, Pd, Au, Ni, Nd, Ir, Cr, Li, Ca, or the like; or a phototransmissive metal oxide, such as an indium tin oxide (ITO), an indium zinc oxide (IZO), a zinc oxide (ZnO), or the like. When a display apparatus has a bottom emission structure, the second electrode 145 may have a reflective function by depositing a layer of Ag, Mg, Al, Pt, Pd, Au, Ni, Nd, Ir, Cr, Li, Ca, or the like. When the first electrode 141 is used as an anode electrode, the first electrode 141 includes a layer formed of a metal oxide having a high work function (absolute value), such as ITO, IZO, ZnO, an indium oxide ($In_2O_3$), or the like. When the first electrode 141 is used as a cathode electrode, a high conductive metal having a low work function (absolute value), such as Ag, Mg, Al, Pt, Pd, Au, Ni, Nd, Ir, Cr, Li, Ca, or the like, is used. The second electrode 145 is used as a cathode electrode when the first electrode 141 is used as an anode electrode, and the second electrode 145 is used as an anode electrode when the first electrode 141 is used as a cathode electrode.

Figure 7:
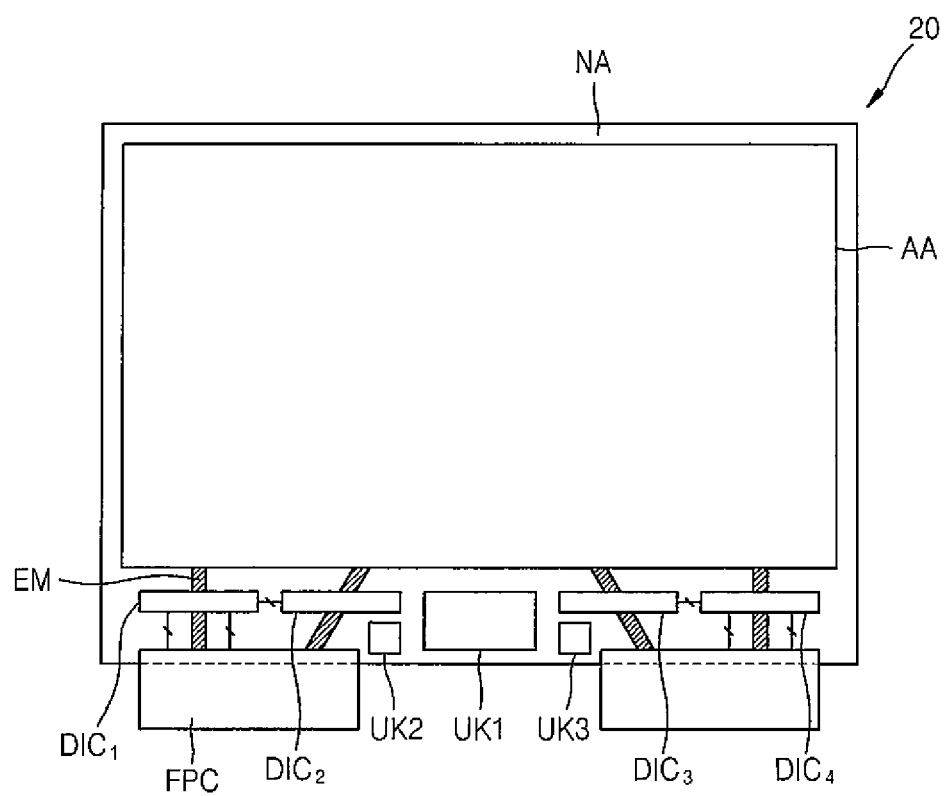
FIGS. 7 and 8 are schematic plan views of two display apparatuses, according to two other embodiments of the present invention.
Figure 8:
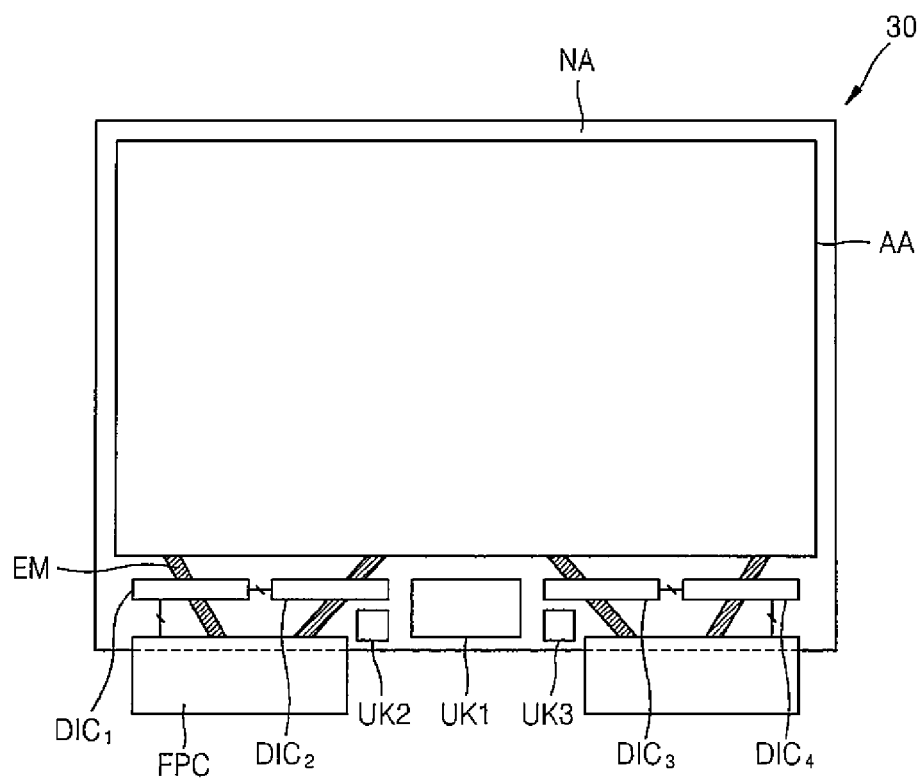

FIGS. 7 and 8 are schematic plan views of display apparatuses 20 and 30, according to two other embodiments of the present invention. Differences between FIGS. 2, 7 and 8 are described below.

Referring to FIG. 7, the display apparatus 20 according to an embodiment of the present invention includes the first through fourth DICs DIC1 through DIC4 coupled to each other in a cascade form. The left first and second DICs DIC1 and DIC2 are coupled in series with each other. The right third and fourth DICs DIC3 and DIC4 are coupled in series with each other.

The first DIC DIC1 receives a control signal from the FPC, generates a driving signal, and supplies the driving signal to the active area AA. In addition, the first DIC DIC1 receives a control signal from the FPC and transfers the control signal to the second DIC DIC2. The second DIC DIC2 generates a driving signal according to the control signal from the first DIC DIC1, and supplies the driving signal to the active area AA.

The fourth DIC DIC4 receives a control signal from the FPC, generates a driving signal, and supplies the driving signal to the active area AA. In addition, the fourth DIC DIC4 receives a control signal from the FPC and transfers the control signal to the third DIG DIC3. The third DIC DIC3 generates a driving signal according to the control signal from the fourth DIC DIC4, and supplies the driving signal to the active area AA.

A first user key UK1 may be disposed in a center portion of the ledge unit L between the second and third DICs DIC2 and DIC3.

In the embodiment of FIG. 7, the second and third DICs DIC2 and DIC3 do not receive a control signal from the FPC but receive control signals from the adjacent first and fourth DICS DIC1 and DIC4 that are coupled in series with the second and third DICs DIC2 and DIC3, respectively. Accordingly, no signal line may be necessarily formed between the second and third DICs DIC2 and DIC3 and the FPC. Thus, the power input units EM may be disposed below the second and third DICs DIC2 and DIC3 in an oblique direction, thereby securing (providing) an additional space in the ledge unit L. Second and third user keys UK2 and UK3 may be respectively disposed in the additional space of the ledge unit L.

Referring to FIG. 8, compared to the embodiment of FIG. 7, the display apparatus 30 includes signal lines between the first and fourth DICs DIC1 and DIC4 and the FPC disposed outside, and thus the power input units EM may be disposed below the first through fourth DICs DIC1 through DIC4 in an oblique direction. Accordingly, spaces between the power input units EM may be uniformly adjusted.

The first through third user keys UK1 through UK3 may be disposed in a center portion of the ledge unit L between the second and third DICs DIC2 and DIC3.

In the present invention, power input units are disposed below DICs provided in a ledge unit of an organic light emitting apparatus, and thus, user keys may be mounted in the ledge unit, thereby minimizing or reducing the bezel thickness of the organic light emitting apparatus.

According to the one or more embodiments of the present invention, a compact organic light-emitting display apparatus may be provided by reducing the bezel thickness thereof.

While the present invention has been particularly shown and described with reference to example embodiments thereof, it will be understood by those of ordinary skill in the art that various changes in form and details may be made therein without departing from the spirit and scope of the present invention as defined by the following claims, and equivalents thereof.

What is claimed is:

1. A thin film transistor array substrate comprising:
   an active area on a surface of the thin film transistor array substrate and comprising a plurality of pixels;
   driver integrated circuits (DICs) at a non-active area around the active area and configured to supply a driving signal to each of the plurality of pixels;
   power input units spaced apart from and located immediately following below the DICs in a direction normal to the surface of the thin film transistor array substrate, and configured to supply power voltages to the active area, the power input units on the surface of the thin film transistor array substrate partially overlapping with the DICs on the surface of the thin film transistor array substrate; and
   a user key mounting area in the non-active area and does not overlap with the DICs.

2. The thin film transistor array substrate of claim 1, further comprising:
   a mechanical button mounted in the user key mounting area.

3. The thin film transistor array substrate of claim 2, wherein a plurality of the DICs are spaced apart from each other.

4. The thin film transistor array substrate of claim 3, wherein the plurality of DICs are coupled in series with each other.

5. The thin film transistor array substrate of claim 3, further comprising:
   a flexible printed circuit (FPC) electrically coupled to at least one of the plurality of DICs.

6. The thin film transistor array substrate of claim 1, further comprising:
   power lines at the active area and configured to supply the power voltages from the power input units to each of the plurality of pixels.

7. The thin film transistor array substrate of claim 6, wherein the power lines comprise:
   a first power line configured to supply a first power voltage to a first electrode of an emission device of each of the plurality of pixels; and
   a second power line configured to supply a second power voltage to a second electrode of the emission devices.

8. An organic light-emitting display apparatus comprising:
   a substrate including an active area and a non-active area around the active area on a surface of the substrate;
   a plurality of pixels at the active area;
   DICs at the non-active area and configured to supply driving signals to the plurality of pixels;
   power input units spaced apart from and located immediately following below the DICs in a direction normal to the surface of the substrate, and configured to supply power voltages to the active area, the power input units on the surface of the substrate partially overlapping with the DICs on the surface of the substrate; and
   user keys mounted in a region of the non-active area that does not overlap with the DICs.

9. The organic light-emitting display apparatus of claim 8, wherein the user keys comprise mechanical buttons.

10. The organic light-emitting display apparatus of claim 8, wherein a plurality of the DICs are spaced apart from each other.

11. The organic light-emitting display apparatus of claim 10, wherein the plurality of DICs are coupled in series with each other.

12. The organic light-emitting display apparatus of claim 10, further comprising:
   an FPC electrically coupled to at least one of the plurality of DICs.

13. The organic light-emitting display apparatus of claim 8, further comprising:

power lines at the active area and configured to supply the power voltages from the power input units to each of the plurality of pixels.

14. The organic light-emitting display apparatus of claim 13, wherein the power lines comprise:
a first power line configured to supply a first power voltage to a first electrode of an emission device of each of the plurality of pixels; and
a second power line configured to supply a second power voltage to a second electrode of the emission device of each of the plurality of pixels.

15. The organic light-emitting display apparatus of claim 8, further comprising:
an encapsulation member facing the substrate; and
a touch panel on the encapsulation member.

* * * * *